United States Patent
Preston et al.

(10) Patent No.: US 11,967,551 B2
(45) Date of Patent: Apr. 23, 2024

(54) STANDARD CELL ARCHITECTURE

(71) Applicant: Arm Limited, Cambridge (GB)

(72) Inventors: Ronald Paxton Preston, Austin, TX (US); Sharath Koodali Edathil, Austin, TX (US)

(73) Assignee: Arm Limited, Cambridge (GB)

( * ) Notice: Subject to any disclaimer, the term of this patent is extended or adjusted under 35 U.S.C. 154(b) by 156 days.

(21) Appl. No.: 17/224,898

(22) Filed: Apr. 7, 2021

(65) Prior Publication Data

US 2022/0328399 A1   Oct. 13, 2022

(51) Int. Cl.
*H01L 23/522*    (2006.01)
*H01L 23/528*    (2006.01)

(52) U.S. Cl.
CPC ........ *H01L 23/5226* (2013.01); *H01L 23/528* (2013.01)

(58) Field of Classification Search
CPC ............. H01L 27/0203; H01L 27/0207; H01L 21/02016; H01L 23/5226; H01L 23/528; H01L 2224/0233; H01L 2224/02373; H01L 2224/0231; H01L 23/485; H01L 2027/11875; H01L 23/522; H01L 23/481
See application file for complete search history.

(56) References Cited

U.S. PATENT DOCUMENTS

| | | | |
|---|---|---|---|
| 8,937,368 B2 * | 1/2015 | Harada | H01L 21/76898 257/621 |
| 9,780,210 B1 * | 10/2017 | Goktepeli | H01L 23/528 |
| 10,950,546 B1 * | 3/2021 | Doornbos | H01L 23/5286 |
| 2011/0095367 A1 * | 4/2011 | Su | H01L 27/0255 257/E21.409 |
| 2014/0342529 A1 * | 11/2014 | Goktepeli | H01L 21/76256 438/458 |
| 2016/0140276 A1 * | 5/2016 | Sarhan | G06F 30/30 716/103 |
| 2017/0373026 A1 * | 12/2017 | Goktepeli | H01L 29/78633 |
| 2019/0296704 A1 * | 9/2019 | Iwamoto | G05F 3/26 |
| 2021/0111105 A1 * | 4/2021 | Kim | H01L 25/162 |
| 2022/0262791 A1 * | 8/2022 | Shi | H01L 23/5286 |

* cited by examiner

*Primary Examiner* — Galina G Yushina
(74) *Attorney, Agent, or Firm* — Pramudji Law Group PLLC; Ari Praumdji

(57) ABSTRACT

Various implementations described herein are directed to a device having a switch structure having an input and an output. The device may have a first thru-silicon via that couples a first backside signal to the input of the switch structure. The device may have a second thru-silicon via that couples a second backside signal to the output of the switch structure.

18 Claims, 5 Drawing Sheets

STANDARD CELL ARCHITECTURE

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some standard cell designs, signal lines are typically routed using only one side of a wafer, such as the frontside. To improve area efficiency, routing can be employed on the typically unused backside of a wafer. However, if the design uses conventional standard cells only, frontside signal lines are used for data and/or voltage distribution to frontside logic that includes standard cells. Unfortunately, these conventional logic designs are inefficient in that use of only frontside signal lines for standard cell connection suffers from area penalty in fabrication and manufacture, and accessing signals routed on the backside can reduce the benefit of adding routing on the backside of the wafer. This is due to a requirement to use a through-silicon via (TSV) to transition signals between the backside and the frontside of the wafer. Conventional standard cells and TSV cells cannot be co-located as they both typically require use of the silicon substrate for their construction. Also, conventional standard cells and TSV cells are typically separated to provide manufacturing clearance. Thus, there exists a need to improve conventional standard cell designs so as to improve area efficiency in modern standard cell architecture.

BRIEF DESCRIPTION OF THE DRAWINGS

Implementations of various standard cell layout schemes and techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to standard cell fabrication schemes and techniques for logic and memory applications in physical design. For instance, various schemes and techniques described herein may provide for enhanced backside signal routing in standard cells having integrated thru-silicon vias (TSVs). Also, the backside signal routing schemes and techniques described herein may be used to provide for routing critical signals between backside metal layers and frontside metal layers.

Various implementations described herein provide for a set of functional standard cells that have integrated thru-silicon vias (TSVs) for use in silicon process technologies that use frontside and backside routing layers in applications where logic devices may be formed on a frontside of a wafer. In various implementations, integrating the TSVs into the logic cells may reduce the overall footprint related to transitioning critical signals between frontside and backside routing layers, and this integration may eliminate substantial local frontside routing, and also, this integration may simplify electronic design automation (EDA) support. The logic set may provide for back-to-back, back-to-front and front-to-back configurable standard cells along with traditional front-to-front standard cells so as to enable logic functions for backside signals and for transitioning signals between frontside and backside of the wafer. As seen by an EDA tool, various implementations of proposed logic cells may have inputs and outputs on the backside metal layers and/or on frontside metal layers.

Various implementations of enabling enhanced standard cells with integrated thru-silicon vias (TSVs) will be described herein with reference to FIGS. 1-5.

Figure 1:
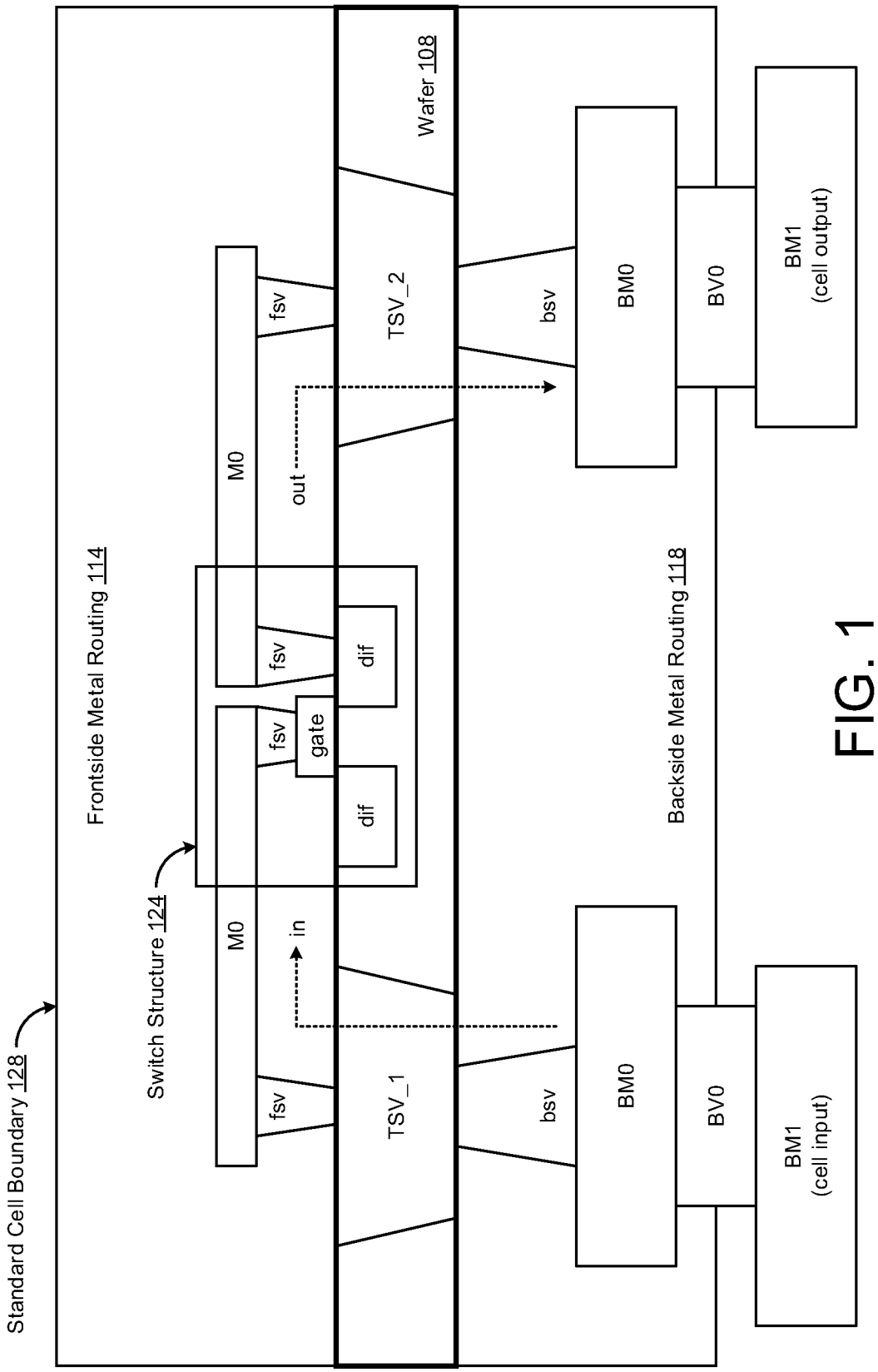
FIG. 1 illustrates a diagram of standard cell architecture with back-to-back coupling in accordance with various implementations described herein.

FIG. 1 shows a diagram 100 of a standard cell having standard cell architecture 104 with back-to-back coupling in accordance with implementations described herein.

In various implementations, the standard cell architecture may be implemented as a system or a device having various integrated circuit (IC) components that are arranged and coupled together as an assemblage or combination of parts that provide for physical circuit designs and various related structures. In some instances, a method of designing, providing, fabricating and/or manufacturing standard cell architecture as an integrated system or device may involve use of various IC circuit components described herein so as to implement the various fabrication schemes and techniques associated therewith. Further, the standard cell architecture may be integrated with computing circuitry and various related components on a single chip, and also, the standard cell architecture may be implemented and incorporated in embedded systems for automotive, electronic, mobile, server and Internet-of-things (IoT) applications, including remote sensor nodes and other related components.

As shown in FIG. 1, the standard cell architecture 104 may refer to a standard cell having a standard cell boundary 128 along with a silicon wafer 108 disposed between a frontside metal routing area 114 and a backside metal routing area 118. The frontside metal routing area 114 may refer to a frontside layer with one or more frontside metal routing lines (e.g., M0, M1, M2, etc.) that may be vertically coupled together with frontside vias (fsv), and also, the backside metal routing area 118 may refer to a backside layer having one or more backside metal routing lines (e.g., BM0, BM1, BM2, etc.) that may be vertically coupled together with backside vias (bsv, BV0). In some instances, one or more or all frontside metal routing lines (e.g., M0, M1, M2, etc.) may be formed and/or disposed within the standard cell boundary 128 so as to be partially or fully included and/or integrated in the standard cell. Further, the standard cell architecture 104 may include thru-silicon vias (TSVs) that are disposed in the wafer 108 so as to pass therethrough, and the TSVs may be utilized to couple the frontside metal lines (e.g., M0) to backside metal lines (e.g., BM0) by way of the frontside/backside vias (fsv, bsv), respectively. Also, the standard cell may refer to a device having the standard cell architecture 104 with a switch structure 124 formed on the wafer 108, which may be referred to as a silicon wafer or a semiconductor wafer.

In some implementations, the standard cell architecture 104 may include a switch structure 124 having a gate disposed between source/drain diffusion regions (dif). In some instances, the switch structure 124 may be configured with an input (in) along an input path from a cell input coupled to backside metal layer (BM1). Also, the switch structure 124 may be configured with an output (out) along an output path from a cell output coupled to backside metal layer (BM1). The TSVs may include a first thru-silicon via (TSV_1) that couples a first backside signal (cell input signal) to the input (in) of the switch structure 124, and the TSVs may include a second thru-silicon via (TSV_2) that couples a second backside signal (cell output signal) to the output (out) of the switch structure 124.

In various implementations, the first thru-silicon via (TSV_1) and the second thru-silicon via (TSV_2) may be integrated as part of the standard cell, and the switch structure 124 may refer to a transistor structure that is formed on the silicon wafer 108. In some instances, the thru-silicon vias (e.g., TSV_1, TSV_2) may be integrated within the standard cell boundary 128. As shown in FIG. 1, the input path is formed backside-to-frontside from the cell input at BM1, through BM0, through TSV_1, through M0 to the gate of the switch structure 124. Also, the output path is formed frontside-to-backside from the diffusion region (dif) of the switch structure 124, through M0, through TSV_2, through BM0 to the cell output at BM1. In this instance, the standard cell has its input coupled backside and its output coupled backside.

As shown in FIG. 1, the backside metal routing area 118 may include one or more backside metal layers (e.g., BM0, BM1) that are formed underneath the silicon wafer 108, wherein a first backside layer (BM0) is formed within the standard cell boundary 128, and wherein a second backside metal layer (BM1) is formed external to the standard cell boundary 128. The backside vias (BV0) may be used to coupled the backside metal layers (BM0, BM1) together, and also, the backside vias (bsv) may be used to coupled the backside metal layers (BM0) to the TSVs (TSV_1, TSV_2). Moreover, the backside metal layers (BM0, BM1) may be used for routing the first backside signal (cell input signal) to the input (in) of the switch structure 124 along the input path by way of the first thru-silicon via (TSV_1), and the backside metal layers (BM0, BM1) may also be used for routing the second backside signal (cell output signal) from the output (out) of the switch structure 124 by way of the second thru-silicon via (TSV_2).

Also, as shown in FIG. 1, the frontside metal routing area 114 may include one or more frontside metal layers (e.g., M0, M1) that are formed above the silicon wafer 108, wherein the frontside layer (M0) is formed within the standard cell boundary 128. Also, the frontside vias (fsv) may be used to coupled the frontside metal layer (M0) to the TSVs (TSV_1, TSV_2). Moreover, the frontside metal layer (M0) may be used for routing a first frontside signal (cell input signal) from the input (in) of the switch structure 124 by way of the first through-silicon via (TSV_1) to a gate of the switch structure 124 along the frontside input path, and also, the frontside metal layer (M0) may also be used for routing a second frontside signal (cell output signal) from a diffusion region (dif) of the switch structure 124 to the second thru-silicon via (TSV_2) along the output path.

Figure 2:
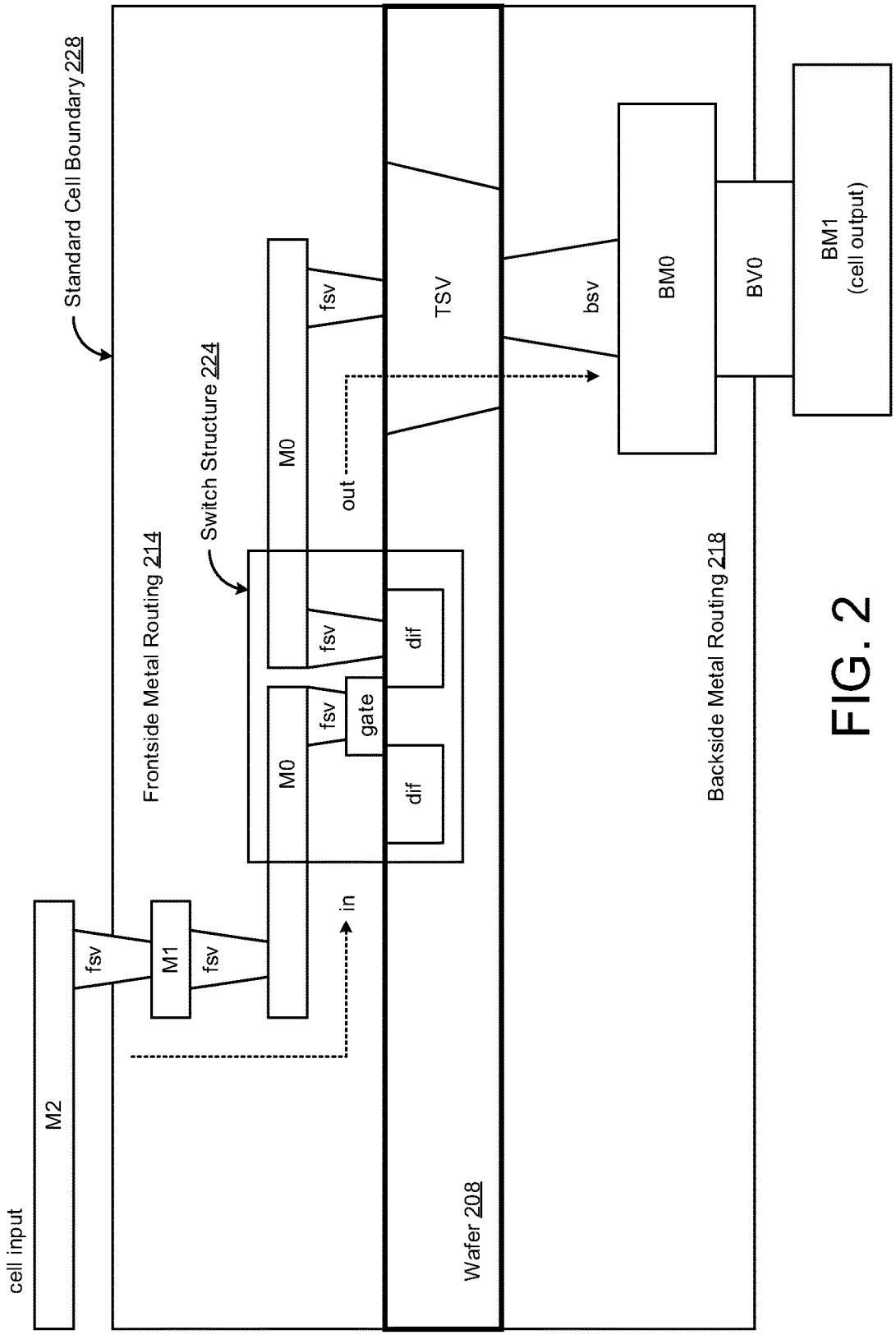
FIG. 2 illustrates a diagram of standard cell architecture with front-to-back coupling in accordance with various implementations described herein.

FIG. 2 shows a diagram 200 of a standard cell having standard cell architecture 204 with front-to-back coupling in accordance with implementations described herein.

In various implementations, the standard cell architecture may be implemented as a system or a device having various integrated circuit (IC) components that are arranged and coupled together as an assemblage or combination of parts that provide for physical circuit designs and various related structures. In some instances, a method of designing, providing, fabricating and/or manufacturing standard cell architecture as an integrated system or device may involve use of various IC circuit components described herein so as to implement the various fabrication schemes and techniques associated therewith. Further, the standard cell architecture may be integrated with computing circuitry and various related components on a single chip, and also, the standard cell architecture may be implemented and incorporated in embedded systems for automotive, electronic, mobile, server and Internet-of-things (IoT) applications, including remote sensor nodes and other related components.

As shown in FIG. 2, the standard cell architecture 204 may refer to a standard cell having a standard cell boundary 228 along with a silicon wafer 208 disposed between a frontside metal routing area 214 and a backside metal routing area 218. The frontside metal routing area 214 may refer to a frontside layer with one or more frontside metal routing lines (e.g., M0, M1, M2, etc.) that may be vertically coupled together with frontside vias (fsv), and also, the backside metal routing area 218 may refer to a backside layer having one or more backside metal routing lines (e.g., BM0, BM1, BM2, etc.) that may be vertically coupled together with backside vias (bsv, BV0). Also, the standard cell architecture 204 may have thru-silicon vias (TSVs) that are disposed in the wafer 208 so as to pass therethrough, and the TSVs may be utilized to couple the frontside metal lines (e.g., M0) to the backside metal lines (e.g., BM0) by way of the vias (fsv, bsv), respectively. Also, the standard cell may refer to a device having the standard cell architecture 204 with a switch structure 224 formed on the wafer 208, which may be referred to as a silicon wafer or a semiconductor wafer.

In some implementations, the standard cell architecture 204 may include a switch structure 224 having a gate disposed between source/drain diffusion regions (dif). In some instances, the switch structure 224 may be configured with an input (in) along an input path from a cell input coupled to frontside metal layer (M2), which may be disposed external to the standard cell boundary 228. Also, the switch structure 224 may be configured with an output (out) along an output path from a cell output coupled to backside metal layer (BM1). Further, the TSV may be used to couple frontside metal layer (M0) to the backside signal (cell output signal) by way of backside metal layers (BM0, BM1).

In various implementations, the TSV may be integrated as part of the standard cell, and the switch structure 224 may refer to a transistor structure that is formed on the silicon wafer 208. In some instances, the thru-silicon vias (e.g., TSV_1, TSV_2) may be integrated within the standard cell boundary 228. As shown in FIG. 2, the input path is formed frontside-to-frontside from the cell input at M2, through M1 and M0 to the gate of the switch structure 224. Also, the output path is formed frontside-to-backside from diffusion region (dif) of the switch structure 224, through M0, through the TSV, through BM0 to the cell output at BM1. In this instance, the standard cell has its input coupled frontside and its output coupled backside.

As shown in FIG. 2, the backside metal routing area 218 may include one or more backside metal layers (e.g., BM0, BM1) that are formed underneath the silicon wafer 208, wherein a first backside layer (BM0) is formed within the standard cell boundary 228, and wherein a second backside metal layer (BM1) is formed external to the standard cell boundary 228. The backside vias (BV0) may be used to coupled the backside metal layers (BM0, BM1) together, and also, the backside vias (bsv) may be used to coupled the backside metal layers (BM0) to the TSV. Also, the frontside metal layers (M0, M1, M2) may be used for routing the frontside input signal (cell input signal) to the input (in) of the switch structure 224 along the input path to the gate, and the backside metal layers (BM0, BM1) may also be used for routing the backside output signal (cell output signal) from the output (out) of the switch structure 224 by way of the thru-silicon via (TSV).

Also, as shown in FIG. 2, the frontside metal routing area 214 may include one or more frontside metal layers (e.g., M0, M1, M2) that are formed above the silicon wafer 208, wherein the frontside layers (M0, M1) are formed within the standard cell boundary 228. In some instances, the frontside vias (fsv) may be used to coupled the frontside metal layer (M0) to the TSV. Also, the frontside metal layers (M0, M1, M2) may be used for routing the frontside input signal (cell input signal) to the input (in) of the switch structure 224 at the gate of the switch structure 224 along the frontside input path, and also, the frontside metal layer (M0) may also be used for routing the output signal (cell output signal) from the diffusion region (dif) of the switch structure 224 through the thru-silicon via (TSV) and then through BM0 along the output path to the cell output at BM1.

Therefore, in various implementations, as shown in FIG. 2, the standard cell architecture 204 may provide the standard cell as a device having an input coupled frontside and an output coupled backside. As such, the standard cell may include the switch structure 224 having an input path (cell input path) and an output path (cell output path), wherein the frontside via (fsv) may be used to couple the frontside signal (cell input signal) to an input (in) of the switch structure 224, and wherein the TSV may be used to couple the backside signal (cell output signal) to the output (out) of the switch structure 224. The frontside metal layers (M0, M1, M2) may be used for routing the frontside input signal (cell input signal) to the gate of the switch structure 224 by way of the input (in) of the switch structure 224, and the backside metal layers (BM0, BM1) may be used for routing the backside output signal (cell output signal) from the output (out) of the switch structure 224 by way of the TSV.

Figure 3:
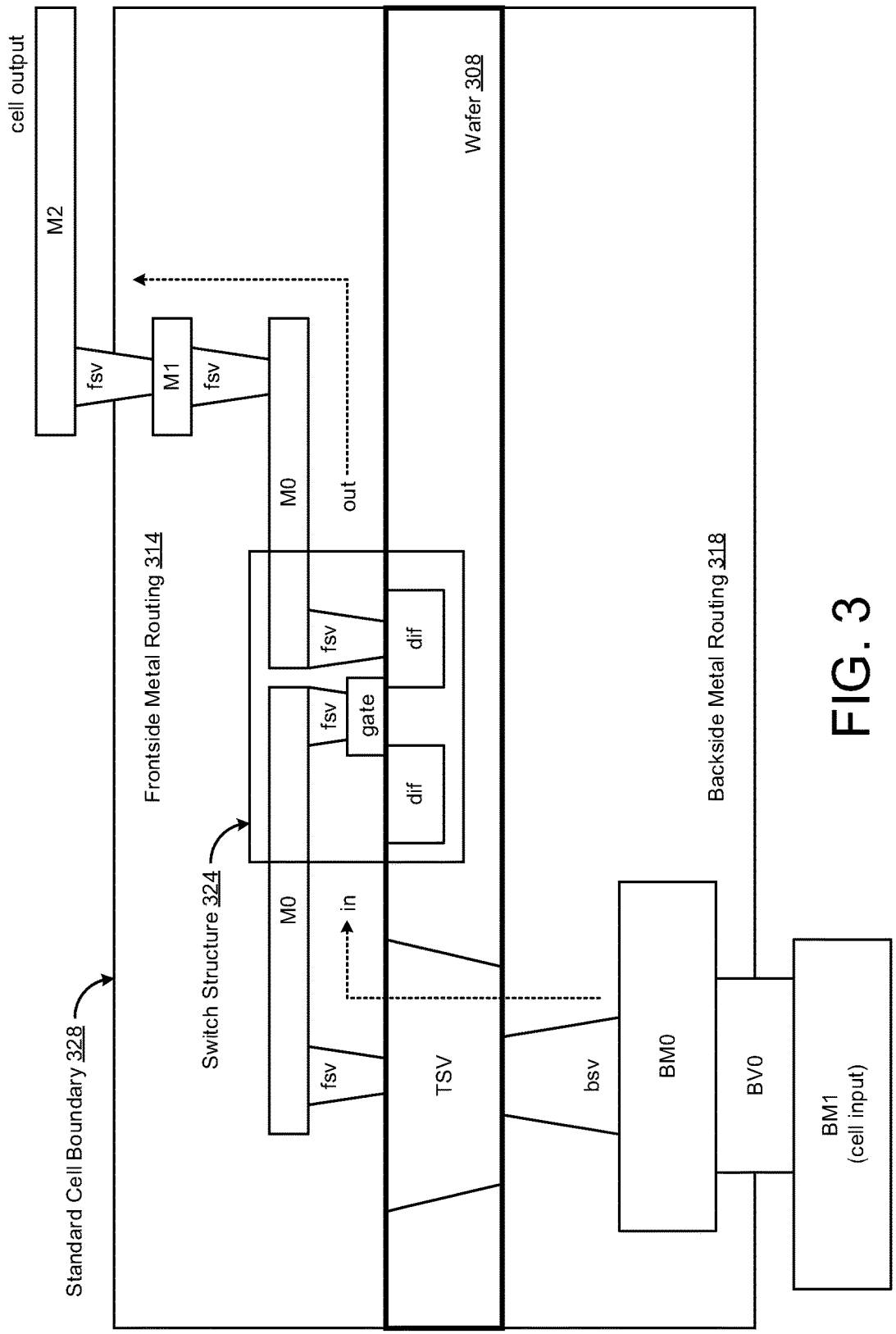
FIG. 3 illustrates a diagram of standard cell architecture with back-to-front coupling in accordance with various implementations described herein.

FIG. 3 shows a diagram 300 of a standard cell having standard cell architecture 304 with back-to-front coupling in accordance with implementations described herein.

In various implementations, the standard cell architecture may be implemented as a system or a device having various integrated circuit (IC) components that are arranged and coupled together as an assemblage or combination of parts that provide for physical circuit designs and various related structures. In some instances, a method of designing, providing, fabricating and/or manufacturing standard cell architecture as an integrated system or device may involve use of various IC circuit components described herein so as to implement the various fabrication schemes and techniques associated therewith. Further, the standard cell architecture may be integrated with computing circuitry and various related components on a single chip, and also, the standard cell architecture may be implemented and incorporated in embedded systems for automotive, electronic, mobile, server and Internet-of-things (IoT) applications, including remote sensor nodes and other related components.

As shown in FIG. 3, the standard cell architecture 304 may refer to a standard cell having a standard cell boundary 328 along with a silicon wafer 308 disposed between a frontside metal routing area 314 and a backside metal routing area 318. The frontside metal routing area 314 may refer to a frontside layer with one or more frontside metal routing lines (e.g., M0, M1, M2, etc.) that may be vertically coupled together with frontside vias (fsv), and also, the backside metal routing area 318 may refer to a backside layer having one or more backside metal routing lines (e.g., BM0, BM1, BM2, etc.) that may be vertically coupled together with backside vias (bsv, BV0). Also, the standard cell architecture 304 may have thru-silicon vias (TSVs) that are disposed in the wafer 308 so as to pass therethrough, and the TSVs may be utilized to couple the frontside metal lines (e.g., M0) to the backside metal lines (e.g., BM0) by way of the vias (fsv, bsv), respectively. Also, the standard cell may refer to a device having the standard cell architecture 304 with a switch structure 324 formed on the wafer 308, which may be referred to as a silicon wafer or a semiconductor wafer.

In some implementations, the standard cell architecture 304 may include a switch structure 324 having a gate disposed between source/drain diffusion regions (dif). In some instances, the switch structure 324 may be configured with an input (in) along an input path from a cell input coupled to backside metal layer (BM1). Also, the switch structure 324 may be configured with an output (out) along an output path from a cell output coupled to frontside metal layer (M2), which may be disposed external to the standard cell boundary 328. Also, the TSV may be used to couple frontside metal layer (M0) to the backside input signal (cell input signal) by way of backside metal layers (BM0, BM1).

In various implementations, the TSV may be integrated as part of the standard cell, and the switch structure 324 may refer to a transistor structure that is formed on the silicon wafer 308. In some instances, the thru-silicon vias (e.g., TSV_1, TSV_2) may be integrated within the standard cell boundary 328. As shown in FIG. 3, the input path is formed backside-to-frontside from the cell input at BM1, through BM0, TSV and M0 to the gate of the switch structure 324. The output path may be formed frontside-to-frontside from diffusion region (dif) of the switch structure 324, through M0 and M1 to the cell output at M2. In this instance, the standard cell has its input coupled backside and its output coupled frontside.

As shown in FIG. 3, the backside metal routing area 318 may include one or more backside metal layers (e.g., BM0, BM1) that are formed underneath the silicon wafer 308, wherein a first backside layer (BM0) is formed within the standard cell boundary 328, and wherein a second backside metal layer (BM1) is formed external to the standard cell boundary 328. The backside vias (BV0) may be used to coupled the backside metal layers (BM0, BM1) together, and also, the backside vias (bsv) may be used to coupled the backside metal layers (BM0) to the TSV. Also, the frontside metal layers (M0, M1, M2) may be used for routing the frontside input signal (cell input signal) to the input (in) of the switch structure 324 along the input path to the gate, and the frontside metal layers (M0, M1, M2) may also be used for routing the frontside output signal (cell output signal) from the output (out) of the switch structure 324 to the cell output at M2.

Also, as shown in FIG. 3, the frontside metal routing area 314 may include one or more frontside metal layers (e.g., M0, M1, M2) that are formed above the silicon wafer 308, wherein the frontside layers (M0, M1) are formed within the standard cell boundary 328. In some instances, the frontside vias (fsv) may be used to coupled the frontside metal layer (M0) to the TSV. Also, the frontside metal layers (M0, M1, M2) may be used for routing the frontside input signal (cell input signal) to the input (in) of the switch structure 324 at the gate of the switch structure 324 along the frontside input path, and also, the frontside metal layer (M0) may also be used for routing the output signal (cell output signal) from the diffusion region (dif) of the switch structure 324 through frontside metal layers M0, M1 and M2 along the output path to the cell output at M2.

Therefore, in various implementations, as shown in FIG. 3, the standard cell architecture 304 may provide the standard cell as a device with its input coupled backside and its output coupled frontside. As such, the standard cell may include the switch structure 324 having an input path (cell input path) and an output path (cell output path), wherein the TSV may be used to couple the backside signal (cell input signal) to an input (in) of the switch structure 324, and wherein the frontside metal layers (M0, M1, M2) may be used to couple the frontside signal (cell output signal) to the output (out) of the switch structure 324. Also, the backside metal layers (BM0, BM1) may be used for routing the backside input signal (cell input signal) to the input (in) of the switch structure 324 by way of the TSV, and further, the frontside metal layers (M0, M1, M2) may be used for routing the frontside output signal (cell output signal) from the gate of the switch structure 324 by way of the output (out) of the switch structure 324 at the M2.

Figure 4:
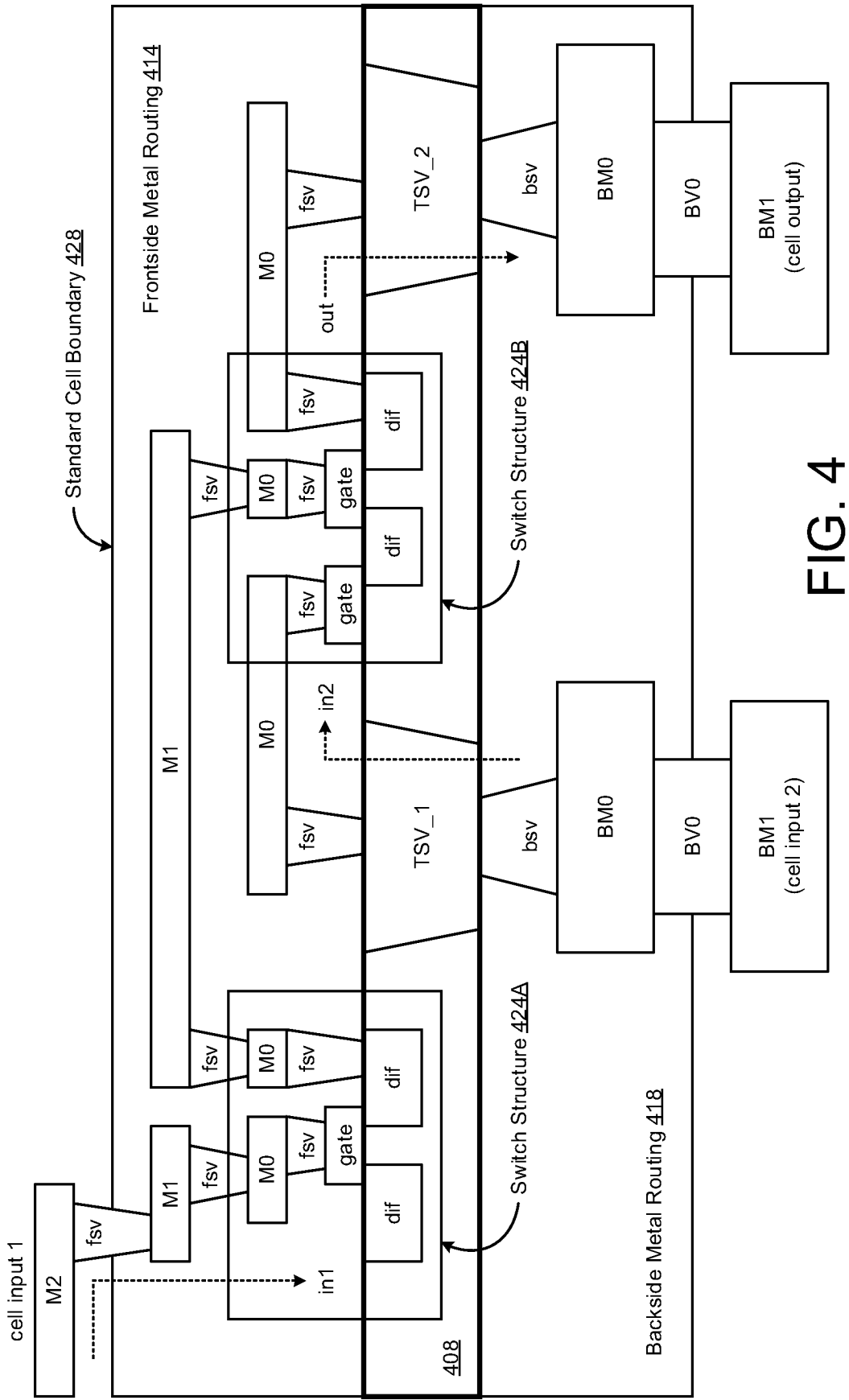
FIG. 4 illustrates a diagram of multi-input standard cell architecture with backside output in accordance with various implementations described herein.

FIG. 4 illustrates a diagram 400 of multi-input (frontside/backside) standard cell architecture 404 with backside output in accordance with various implementations described herein. The multi-input standard cell architecture 404 shown in FIG. 4 may include similar features, components, behaviors and characteristics as the other standard cell architectures that are shown in FIGS. 1-3.

As shown in FIG. 4, the standard cell architecture 404 may refer to a standard cell having multiple switch structures 424A, 424B formed within a standard cell boundary 428 and formed on a silicon wafer 408 disposed between a frontside metal routing area 414 and a backside metal routing area 418. The frontside metal routing area 414 refers to a frontside routing layer with one or more frontside metal routing lines (e.g., M0, M1, M2, etc.) that are vertically coupled together with frontside vias (fsv), and also, the backside metal routing area 418 may refer to a backside routing layer having one or more backside metal routing lines (e.g., BM0, BM1, BM2, etc.) that may be vertically coupled together with backside vias (bsv, BV0). The standard cell architecture 404 may have thru-silicon vias (TSVs) that are disposed in the silicon wafer 408 so as to pass therethrough, and the TSVs may be used to couple the frontside metal lines (e.g., M0) to the backside metal lines (e.g., BM0) by way of the vias (fsv, bsv), respectively. Also, the standard cell may refer to a device having the standard cell architecture 404 with the switch structures 424A, 424B formed on the silicon wafer 408, which may be referred to as a semiconductor wafer or some other similar type of wafer.

In various implementations, the standard cell architecture 404 may include multiple switch structures, including, e.g., first and second switch structures 424A, 424B having gates disposed between source/drain diffusion regions (dif). Also, in various instances, the switch structures 424A, 424B may be configured with inputs (in) along multiple input paths from cell inputs (e.g., cell input 1, cell input 2) that are coupled to frontside/backside metal layers (e.g., M2, BM1). Also, in various instances, the switch structures 424A, 424B may be configured with outputs (out) along output paths to a cell output that is coupled to backside metal layer (BM1). The TSVs may include a first thru-silicon via (TSV_1) that couples a backside input signal (cell input signal 2) to the input (in) of the switch structure 424B, and also, the TSVs may have a second thru-silicon via (TSV_2) that couples a backside output signal (cell output signal) to the outputs (out) of the switch structures 424A, 424B.

In various implementations, the first thru-silicon via (TSV_1) and the second thru-silicon via (TSV_2) may be integrated as part of the standard cell, and the switch structures 424A, 424B may refer to transistor structures that are formed on the silicon wafer 408. In some instances, the thru-silicon vias (e.g., TSV_1, TSV_2) may be integrated within the standard cell boundary 428. As shown in FIG. 4, the first input path is formed frontside-to-frontside from the first cell input 1 at M2, through M1 and M0 to the gate of the first switch structure 424A, and the output path is formed frontside-to-frontside from the diffusion region (dif) of the first switch structure 424A, through M0 and M1, back through M0 to the gate of the second switch structure 424B. Also, as shown in FIG. 4, the second input path is formed backside-to-frontside from the second cell input 2 at BM1, through BM0, TSV_1 and M0 to another gate of second switch structure 424B, and also, the output path is formed frontside-to-backside from the diffusion region (dif) of the second switch structure 424B, through M0 and TSV_2, through BM0 to the cell output at BM1. In this instance, the standard cell has its first input (cell input 1) coupled frontside, its second input (cell input 2) coupled backside, and its output coupled backside.

Figure 5:
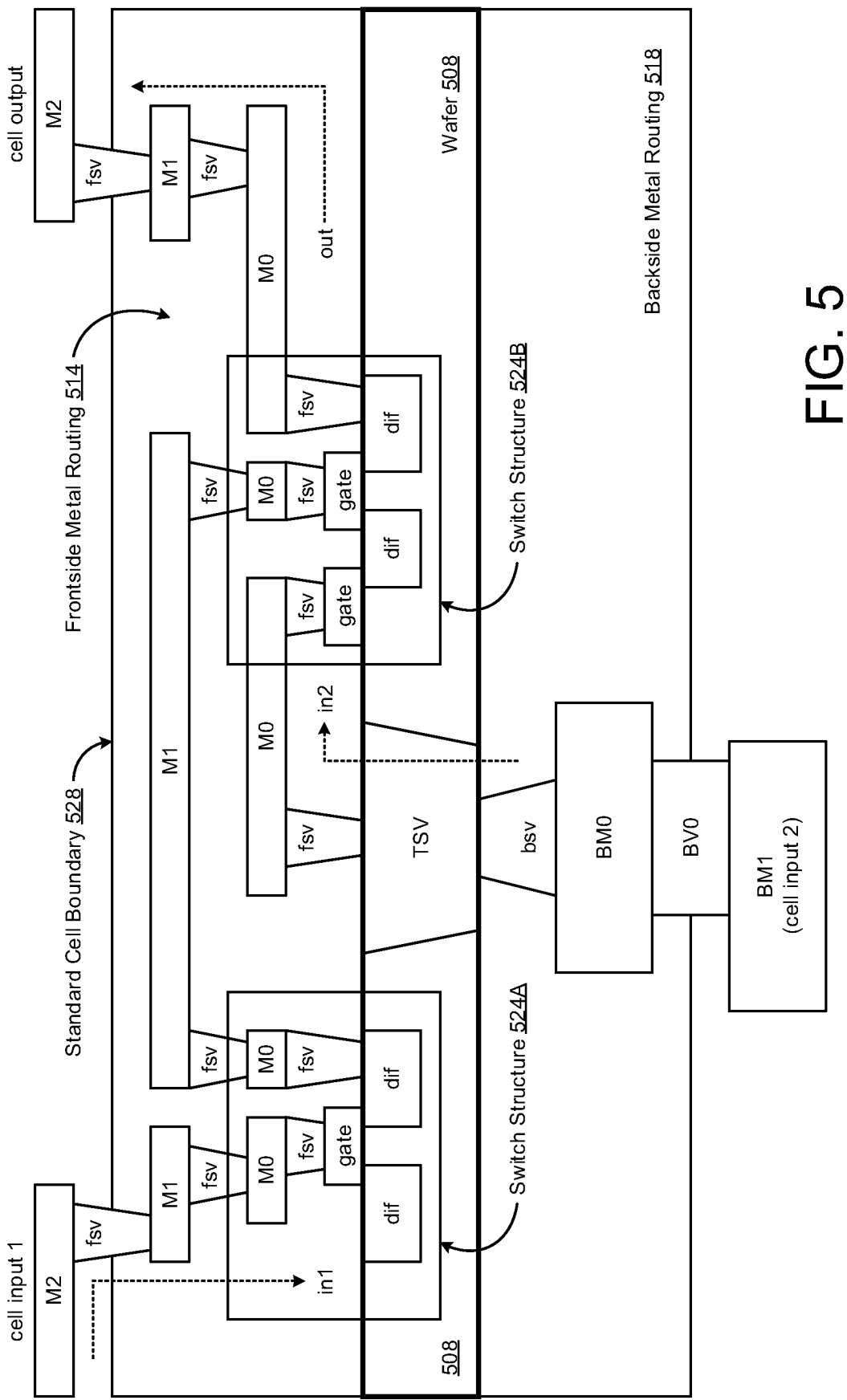
FIG. 5 illustrates a diagram of multi-input standard cell architecture with frontside output in accordance with various implementations described herein.

FIG. 5 illustrates a diagram 500 of multi-input (frontside/backside) standard cell architecture 504 with frontside output in accordance with various implementations described herein. The multi-input standard cell architecture 504 shown in FIG. 5 may include similar features, components, behaviors and characteristics as the other standard cell architectures that are shown in FIGS. 1-4.

As shown in FIG. 5, the standard cell architecture 504 may refer to a standard cell having multiple switch structures 524A, 524B formed within a standard cell boundary 528 and formed on a silicon wafer 508 disposed between a frontside metal routing area 514 and a backside metal routing area 518. The frontside metal routing area 514 refers to a frontside routing layer with one or more frontside metal routing lines (e.g., M0, M1, M2, etc.) that are vertically coupled together with frontside vias (fsv), and also, the backside metal routing area 518 may refer to a backside routing layer having one or more backside metal routing lines (e.g., BM0, BM1, BM2, etc.) that may be vertically coupled together with backside vias (bsv, BV0). The standard cell architecture 504 may have thru-silicon vias (TSVs) that are disposed in the silicon wafer 508 so as to pass therethrough, and the TSVs may be used to couple the frontside metal lines (e.g., M0) to the backside metal lines (e.g., BM0) by way of the vias (fsv, bsv), respectively. Also, the standard cell may refer to a device having the standard cell architecture 504 with the switch structures 524A, 524B formed on the silicon wafer 508, which may be referred to as a semiconductor wafer or some other similar type of wafer.

In various implementations, the standard cell architecture 504 may include multiple switch structures, including, e.g., first and second switch structures 524A, 524B having gates disposed between source/drain diffusion regions (dif). Also, in various instances, the switch structures 524A, 524B may be configured with inputs (in) along multiple input paths from cell inputs (e.g., cell input 1, cell input 2) that are coupled to frontside/backside metal layers (e.g., M2, BM1). Also, in various instances, the switch structures 524A, 524B may be configured with outputs (out) along output paths to a cell output that is coupled to frontside metal layer (M2). Also, in some instances, the TSV may be used to couple a backside input signal (cell input signal 2) to the input (in) of the switch structure 524B.

In various implementations, the TSV may be integrated as part of the standard cell, and also, the switch structures 524A, 524B may refer to transistor structures that are formed on the silicon wafer 508. As shown in FIG. 5, the first input path may be formed frontside-to-frontside from the first cell input 1 at M2, through M1 and M0 to the gate of the first switch structure 524A, and the output path is formed frontside-to-frontside from the diffusion region (dif) of the first switch structure 524A, through M0 and M1, back through M0 to the gate of the second switch structure 524B. Also, as shown in FIG. 5, the second input path may be formed backside-to-frontside from the second cell input 2 at BM1, through BM0, TSV_1 and M0 to another gate of second switch structure 524B, and also, the output path may be formed frontside-to-frontside from another diffusion region (dif) of the second switch structure 524B, through M0 and M1 to the cell output at M2, which may be disposed external to the standard cell boundary 528. In this instance, the standard cell has its first input (cell input 1) coupled frontside, its second input (cell input 2) coupled backside, and its output coupled frontside.

There are advantages realized by employing metal routing on the frontside of the wafer and also on the backside of the wafer. One particularly attractive scenario is to enable different pitch lines on the backside versus the frontside. For instance, if the backside layers employ a coarse pitch, then they may be allocated to various critical signals, such as, e.g., clock signals and/or other high-speed signals. In some instances, to route a critical signal on a coarse pitch layer in a typical process, the signal typically has to via through multiple finer pitch lower layers. These vias and associated metal layers may add parasitic resistance and/or capacitance to critical signals, and they may also consume routing resources that potentially impact area. If routing is added on the backside of the wafer using coarser pitch design rules, these layers may be used to provide power connections or high-speed signal connections without having to via through multiple fine pitch layers, which may potentially provide area, power and/or performance benefits. Also, to connect between the frontside and backside of the wafer, a thru-silicon via (TSV) may be used, wherein the presence of a TSV may complicate the physical design during placement and routing. Since TSVs are "in" in the silicon wafer, they may not be placed in the same location as active transistors. This may result in a conflict between placement of TSVs and placement of functional standard cells. During routing, the TSVs may become fixed locations that provide the only points at which signals may be moved between the two sides of the wafer. These TSVs may not be freely moved during routing as they may not be placed in positions that overlap with normal standard cells.

Various implementations described herein integrate the TSV structures for making signal connection(s) to the backside of the die within a logic standard cell and/or within the boundary of the logic standard cell. Some of the logic cells may be inverters or buffers, and various complex cells may be constructed for special situations. The standard cells may be designed with appropriate spacings between the TSVs and other frontside structures including devices and routing layers. The cell library includes cells that make backside-to-backside connections, backside-to-frontside connections, and frontside-to-backside connections. In this taxonomy, some other standard cells may include and utilize frontside-to-frontside connections. Aspects of the present disclosure may provide for adding cells from various other classes (backside-to-backside, backside-to-frontside, and frontside-to-backside) to a library that already has a full set of frontside-to-frontside standard cells. The frontside-to-backside version may obtain inputs from the frontside, perform some logic function, and then place the resulting output on the backside through a TSV, and this may provide a mechanism to move a signal from the frontside logic and routing and transition the signal to the backside routing layers. The backside-to-backside cells include connections for both the input and outputs using the backside layers of the die and provide separate TSV connections through to logic on the frontside. This type of standard logic cell may be used to implement a buffer and/or repeater for a signal on the backside of the wafer. The backside-to-frontside cell provides the reverse process of the frontside-to-backside cell, taking its input from the backside through a TSV, and places the output onto a frontside layer thus bringing a backside signal back to the frontside. Due to the large size of typical TSVs, back-to-front cells and back-to-back cells may typically have fewer inputs, and there may be a more limited set of logic functions implemented compared to the front-to-back cells.

By integrating the TSV structure into a standard cell, significant area savings may be achieved as the TSV connection may be formed to a known structure, and the layout may be optimized to use minimum design rules. Without aspects of the present disclosure, as in a conventional standard cell design, when a signal from the backside makes a connection to a standard cell (either input or output), a separate TSV cell is needed to be placed into the design to make the connection and to block the area so as to prevent regular standard cells with active devices from being placed in the same position. In the case of some backside-to-backside cells, at least two TSV structures may be needed. Without aspects of the present disclosure, a TSV cell may be used to create the via and connection between the frontside and backside of the wafer. To connect the TSV cell to logic on the frontside of the die, additional frontside routing resources may be needed to connect between the TSV and the inputs or the outputs of normal standard cells. These connections on the frontside may consume valuable lower layer routing resources that adds to routing congestion and also adds parasitic resistance and capacitance to the signals. With aspects of the present disclosure, connections between the TSV and the frontside logic may be achieved wholly within the standard cell and may be made without exposing the signal to the fabrication process and consuming routing resources on the frontside of the wafer.

Also, aspects of the present disclosure simplify design routing flows and algorithms by allowing for the standard cell design to be partitioned into separate frontside and backside operations. Without aspects of the present disclosure, signals on the backside of the wafer must be brought to the frontside so as to make connections to logic standard cells for their initial creation, repeaters/buffers and for final destination connections. With aspects of the present disclosure, no visible signal may be present on the frontside and backsides of the die simultaneously. From some perspectives, aspects of the present disclosure provide for ports on the backside to create backside signals and for their eventual destinations, which may allow the routing process to be split in separate frontside and backside independent operations.

Also, for buffer/repeater insertion (backside-to-backside connections) routing on the backside does not cause any noticeable impact on the frontside of the wafer. This impact is simply the insertion of the buffer/repeater cell without any visible routing on the frontside routing. In some instances, the normal frontside operation may view a backside-to-backside repeater as a blocked area with no connectivity, and in some process flows, some signals may be picked to be routed on the backside of the wafer typically due to criticality such as for clock signals and other high-speed signals. The process may proceed through placement using estimated routing paths and parasitics for the frontside and backside signals. During routing operation, frontside and backside routing operations may be achieved independently of each other, and the signals that are on the frontside may be assigned tracks and routed as usual. Upon completion of frontside routing, signals on the backside may be routed. Also, according to some aspects of the present disclosure, there may be no interaction between the backside routing and frontside routing as they are made as separate signals connecting to different pins in the cells.

In some implementations, a backside-to-backside repeater may be preassigned during placement or added later in the process flow to assist with fixing electrical or timing issues. When the backside-to-backside repeater is added, an appropriate empty area may need to be located on the frontside of the die for placing the cell. If space is needed on the frontside of the wafer for placement of the repeater, the standard cell design may look like a typical cell with additional logic, but the added cell may not create new routing on the frontside as both pin connections may be on the backside of the wafer. One possible usage model for aspects of the present disclosure may be used to enable a full-chip design reserving backside routing resources for full-chip or inter-block routing. In this scenario, blocks may be designed and routing may be completed primarily using frontside routing, and signals to the block may be made by using frontside-to-backside cells for block outputs and backside-to-frontside cells for block inputs. The pins on the block may refer to the pins on these cells. When the blocks are integrated at a full-chip level, the inter-block pins on the backside are routed to connect the blocks together. This may be an attractive solution to enable re-use of blocks in multiple scenarios as pin positions are not forced to be placed onto block boundaries and frontside routing resources are not consumed to route the inter-block signals.

It should be intended that the subject matter of the claims not be limited to various implementations and/or illustrations provided herein, but should include any modified forms of those implementations including portions of implementations and combinations of various elements in reference to different implementations in accordance with the claims. It should also be appreciated that in development of any such implementation, as in any engineering or design project, numerous implementation-specific decisions should be made to achieve developers' specific goals, such as, e.g., compliance with system-related constraints and/or business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device having a switch structure with an input and an output. The device may include a first thru-silicon via that couples a first backside signal to the input of the switch structure. The device may have a second thru-silicon via that couples a second backside signal to the output of the switch structure.

Described herein are various implementations of a device having a switch structure with an input and an output. The device may have a frontside via that couples a frontside signal to the input of the switch structure. The device may have a thru-silicon via that couples a backside signal to the output of the switch structure.

Described herein are various implementations of a device having a switch structure with an input and an output. The device may have a thru-silicon via that couples a backside signal to the input of the switch structure. The device may have a frontside via that couples a frontside signal to the output of the switch structure.

Reference has been made in detail to various implementations, examples of which are illustrated in accompanying drawings and figures. In the following detailed description, numerous specific details are set forth to provide a thorough understanding of the disclosure provided herein. However, the disclosure provided herein may be practiced without these specific details. In various implementations, well-known methods, procedures, components, circuits and networks have not been described in detail so as not to unnecessarily obscure details of the embodiments.

It should also be understood that, although various terms first, second, etc. may be used herein to describe various elements, these elements should not be limited by these terms. These terms are only used to distinguish one element from another. For instance, a first element could be termed a second element, and, similarly, a second element could be termed a first element. Also, the first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, specific features and acts described above are disclosed as example forms of implementing the claims.

What is claimed is:

1. A device comprising:
a switch structure having an input and an output, wherein the switch structure is formed in and on a silicon wafer;
a first thru-silicon via disposed beside a first diffusion region of the switch structure, wherein the first thru-silicon via passes through the silicon wafer and is operably connected to a backside metal layer formed underneath the silicon wafer to a frontside metal layer formed above the silicon wafer, and wherein the first thru-silicon via couples a first backside signal to a gate of the switch structure by way of the input of the switch structure; and
a second thru-silicon via disposed beside a second diffusion region of the switch structure, wherein the second thru-silicon via passes through the silicon wafer and is operably connected to the frontside metal layer to the backside metal layer, and wherein the second thru-silicon via couples a second backside signal to the output of the switch structure.

2. The device of claim 1, wherein the device refers to a standard cell having a standard cell architecture with the switch structure formed in and on the silicon wafer.

3. The device of claim 2, wherein the first thru-silicon via and the second thru-silicon via are integrated as parts of the standard cell.

4. The device of claim 2, wherein the switch structure refers to a transistor structure that is formed in and on the silicon wafer.

5. The device of claim 2, wherein: the backside metal layer is used for routing the first backside signal to the input of the switch structure by way of the first thru-silicon via, and
the backside metal layer is used for routing the second backside signal from the output of the switch structure by way of the second thru-silicon via.

6. The device of claim 2, wherein: the frontside metal layer is used for routing a first frontside signal from the input of the switch structure to the gate of the switch structure, and
the frontside metal layer is used for routing a second frontside signal from a diffusion region of the switch structure to the second thru-silicon via.

7. A device comprising:
a switch structure having an input and an output, wherein the switch structure is formed in and on a silicon wafer;
a frontside metal layer formed above the silicon wafer;
a frontside via that couples a frontside signal from an external source to a gate of the switch structure by way of the input of the switch structure, wherein the frontside metal layer is used for routing the frontside signal to the gate of the switch structure; and
a thru-silicon via, disposed beside a first diffusion region of the switch structure, wherein the thru-silicon via passes through the silicon wafer and is operably connected to the frontside metal layer formed above the silicon wafer, that couples a backside signal to the output of the switch structure.

8. The device of claim 7, wherein the device refers to a standard cell having a standard cell architecture with the switch structure formed in and on the silicon wafer.

9. The device of claim 8, wherein the thru-silicon via is integrated as part of the standard cell.

10. The device of claim 8, wherein the switch structure refers to a transistor structure that is formed in and on the silicon wafer.

11. The device of claim 8, further comprising:
a backside metal layer formed underneath the silicon wafer.

12. The device of claim 11, wherein:
the backside metal layer is used for routing the backside signal from the output of the switch structure by way of the thru-silicon via.

13. A device comprising:
a switch structure having an input and an output, wherein the switch structure is formed in and on a silicon wafer;
a frontside metal layer formed above the silicon wafer;
a thru-silicon via, disposed beside a first diffusion region of the switch structure, wherein the thru-silicon via passes through the silicon wafer and is operably connected to a backside metal layer formed underneath the silicon wafer to a frontside metal layer formed above the silicon wafer, that couples a backside signal to a gate of the switch structure by way of the input of the switch structure; and
a frontside via that couples the output of the switch structure to an external output, wherein the frontside metal layer is used for routing the frontside via from the output of the switch structure to the external output.

14. The device of claim 13, wherein the device refers to a standard cell having a standard cell architecture with the switch structure formed in and on the silicon wafer.

15. The device of claim 14, wherein the thru-silicon via is integrated as part of the standard cell.

16. The device of claim 14, wherein the switch structure refers to a transistor structure that is formed in and on the silicon wafer.

17. The device of claim 14, further comprising:
a backside metal layer formed underneath the silicon wafer.

18. The device of claim 17, wherein:
the backside metal layer is used for routing the backside signal to the input of the switch structure by way of the thru-silicon via.

* * * * *